United States Patent [19]
Distefano et al.

[11] Patent Number: 5,776,796
[45] Date of Patent: Jul. 7, 1998

[54] METHOD OF ENCAPSULATING A SEMICONDUCTOR PACKAGE

[75] Inventors: Thomas H. Distefano, Monte Sereno; John W. Smith, Palo Alto; Joseph Fjelstad, Sunnyvale; Craig S. Mitchell, Santa Clara; Konstantine Karavakis, Cupertino, all of Calif.

[73] Assignee: Tessera, Inc., San Jose, Calif.

[21] Appl. No.: 726,697

[22] Filed: Oct. 7, 1996

Related U.S. Application Data

[63] Continuation-in-part of Ser. No. 246,113, May 19, 1994, Pat. No. 5,663,106, and Ser. No. 610,610, Mar. 7, 1996.

[51] Int. Cl.$^6$ .................................................. H01L 21/44
[52] U.S. Cl. .......................... 438/106; 438/112; 438/126
[58] Field of Search ................................ 437/209, 211, 437/212, 214, 215, 216, 219

[56] References Cited

U.S. PATENT DOCUMENTS

| | | |
|---|---|---|
| 3,390,308 | 6/1968 | Marley . |
| 3,413,713 | 12/1968 | Helda et al. . |
| 3,614,832 | 10/1971 | Chance et al. . |
| 3,868,724 | 2/1975 | Perrino . |
| 3,906,144 | 9/1975 | Wiley . |
| 4,012,766 | 3/1977 | Phillips et al. . |
| 4,017,495 | 4/1977 | Jaffe et al. . |
| 4,143,456 | 3/1979 | Inoue . |
| 4,163,072 | 7/1979 | Soos . |
| 4,312,116 | 1/1982 | Moser et al. . |
| 4,374,080 | 2/1983 | Schroeder . |
| 4,536,469 | 8/1985 | Adlerstein . |
| 4,566,184 | 1/1986 | Higgins et al. . |
| 4,616,412 | 10/1986 | Schroeder . |
| 4,658,332 | 4/1987 | Baker et al. . |
| 4,701,999 | 10/1987 | Palmer . |
| 4,707,724 | 11/1987 | Suzuki et al. . |
| 4,710,798 | 12/1987 | Marcantonio . |
| 4,766,670 | 8/1988 | Gazdik et al. . |
| 4,829,666 | 5/1989 | Haghiri-Tehrani et al. . |
| 4,847,146 | 7/1989 | Yeh et al. . |
| 4,857,483 | 8/1989 | Steffen et al. . |
| 4,860,088 | 8/1989 | Smith et al. . |
| 4,900,501 | 2/1990 | Saeki et al. . |
| 4,913,930 | 4/1990 | Getson . |
| 4,915,607 | 4/1990 | Medders et al. . |
| 4,918,811 | 4/1990 | Eichelberger et al. . |
| 4,920,074 | 4/1990 | Shimzu et al. . |

(List continued on next page.)

FOREIGN PATENT DOCUMENTS

| | | |
|---|---|---|
| 60-77446 | 5/1985 | Japan . |
| 1-278755 | 11/1989 | Japan . |
| 1-293528 | 11/1989 | Japan . |
| 2-56941 | 2/1990 | Japan . |
| 4-137641 | 5/1992 | Japan . |
| WO 89/10005 | 10/1989 | WIPO . |

OTHER PUBLICATIONS

Microelectronics Packaging Handbook, 1989, pp. 420–423, 1132, Rao. R. Tummala and Eugene J. Rymaszewski.

*Primary Examiner*—Kevin Picardat
*Attorney, Agent, or Firm*—Lerner, David, Littenberg, Krumholz & Mentlik

[57] ABSTRACT

A method of encapsulating a semiconductor device. The encapsulation method includes a semiconductor chip package assembly having a spacer layer between a top surface of a sheet-like substrate and a contact bearing surface of a semiconductor chip, wherein the substrate has conductive leads thereon, the leads being electrically connected to terminals on a first end and bonded to respective chip contacts on a second end. Typically, the spacer layer is comprised of a compliant or elastomeric material. A protective layer is attached on a bottom surface of the substrate so as to cover the terminals on the substrate. A flowable, curable encapsulant material is deposited around a periphery of the semiconductor chip after the attachment of the protective layer so as to encapsulate the leads. The encapsulant material is then cured. Typically, this encapsulation method is performed on a plurality of chip assemblies simultaneously.

47 Claims, 8 Drawing Sheets

U.S. PATENT DOCUMENTS

| | | | |
|---|---|---|---|
| 4,953,173 | 8/1990 | Fujitsu . | |
| 4,955,132 | 9/1990 | Ozawa . | |
| 4,975,765 | 12/1990 | Ackermann et al. . | |
| 4,999,319 | 3/1991 | Hamano et al. . | |
| 5,037,779 | 8/1991 | Whalley et al. . | |
| 5,052,907 | 10/1991 | Matumoto et al. . | |
| 5,055,913 | 10/1991 | Haghiri-Tehrani . | |
| 5,075,760 | 12/1991 | Nakashima et al. . | |
| 5,120,678 | 6/1992 | Moore et al. | 437/211 |
| 5,130,781 | 7/1992 | Kovac et al. . | |
| 5,148,265 | 9/1992 | Khandros et al. | 257/773 |
| 5,148,266 | 9/1992 | Khandros et al. | 257/773 |
| 5,193,732 | 3/1993 | Interrante et al. . | |
| 5,194,930 | 3/1993 | Papathomas et al. | 257/773 |
| 5,203,076 | 4/1993 | Banerji et al. | 29/840 |
| 5,249,101 | 9/1993 | Frey et al. | 437/211 |
| 5,252,784 | 10/1993 | Asai et al. . | |
| 5,258,330 | 11/1993 | Khandros et al. . | |
| 5,288,944 | 2/1994 | Bronson et al. | 437/209 |
| 5,289,346 | 2/1994 | Carey et al. | 437/209 |
| 5,302,101 | 4/1994 | Nishimura . | |
| 5,304,252 | 4/1994 | Condra et al. . | |
| 5,304,512 | 4/1994 | Arai et al. . | |
| 5,336,931 | 8/1994 | Juskey et al. . | |
| 5,355,283 | 10/1994 | Marrs et al. . | |
| 5,371,044 | 12/1994 | Yoshida et al. . | |
| 5,385,869 | 1/1995 | Liu et al. | 437/209 |
| 5,394,009 | 2/1995 | Loo . | |
| 5,409,362 | 4/1995 | Neu . | |
| 5,409,865 | 4/1995 | Karnezos . | |
| 5,409,866 | 4/1995 | Sato et al. . | |
| 5,477,611 | 12/1995 | Sweis et al. . | |

METHOD OF ENCAPSULATING A SEMICONDUCTOR PACKAGE

Cross Reference to Related Applications

This application is a continuation-in-part of commonly assigned U.S. patent application Ser. No. 246,113 filed May 19, 1994 now U.S. Pat. No. 5,663,106 and commonly assigned U.S. patent application Ser. No. 610,610 filed Mar. 7, 1996, the disclosures of both said applications being incorporated by reference herein.

FIELD OF THE INVENTION

The present invention relates generally to a method of encapsulating a semiconductor package assembly or an array of such semiconductor package assemblies typically arranged on a supporting panel, while protecting the package's exposed terminals.

BACKGROUND OF THE INVENTION

In the construction of semiconductor chip package assemblies, it has been found desirable to interpose encapsulating material between and/or around elements of the semiconductor packages in an effort to reduce and/or redistribute the strain and stress on the connections between the semiconductor chip and a supporting circuitized substrate during operation of the chip, and to seal the elements against corrosion, as well as to insure intimate contact between the encapsulant, the semiconductor die and the other elements of the chip package.

It is often desirable to package a semiconductor chip assembly such that it can be handled with less fear of damage to the assembly so that a heat sink can be married with the semiconductor chip. However, if a semiconductor chip assembly is to be so packaged, the utmost care must be taken during the packaging process to avoid affecting the integrity of the terminals on the chip carrier. In particular, it is important to avoid contaminating the terminals on the chip carrier with the encapsulant.

Certain designs have reduced solder connection fatigue by redistributing the thermal cycling stress into a portion of the chip package itself. An example of such a design is shown in U.S. Pat. Nos. 5,148,265 and 5,148,266, the both disclosures of which are incorporated herein by reference. One disclosed embodiment of these patents shows the use of a chip carrier in combination with a compliant layer to reduce the coefficient of thermal expansion ("CTE") mismatch problems. Typically, the compliant layer includes an elastomeric layer which, in the finished package, is disposed between the chip carrier and the face surface of the chip. The compliant layer provides resiliency to the individual terminals, allowing each terminal to move in relation to its electrically connected chip contact to accommodate CTE mismatch as necessary during testing, final assembly and thermal cycling of the device.

In some arrangements used heretofore, the compliant layer is formed by stenciling a thermoset resin onto the chip carrier and then curing the resin. Next, additional resin is applied to the exposed surface of the cured layer, this additional resin is partially cured, and the resulting tacky adhesive surface was used to bond the elastomeric layer to the chip and chip carrier. Once attached, the entire structure is heated and fully cured. The leads are then bonded to respective chip contacts. An encapsulant material is then disposed under and around the leads from the terminal side of the assembly. This process amounts to very carefully depositing a controlled amount of encapsulant on the periphery of the contact surface of the chip from the terminal side of the assembly, building layer upon layer of encapsulant until the leads are fully encapsulated. In such a process, the encapsulant is held in place by the surface tension of the encapsulant material between the dielectric layer and the contact bearing surface of the chip. Using such a method, the encapsulant material may creep on to the exposed surface of the dielectric layer potentially contaminating the terminals and also overcoming the surface tension of the encapsulant further causing the encapsulant to get onto other surfaces of the assembly or onto adjacent chip assemblies.

Accordingly, a method of controlling the encapsulation of a semiconductor chip package assembly such that the integrity of the terminals and leads are not affected is desirable.

SUMMARY OF THE INVENTION

The present invention provides a method of encapsulating a semiconductor device.

The encapsulation method according to the present invention includes a semiconductor chip package assembly having a spacer layer between a top surface of a sheet-like substrate and a contact bearing surface of a semiconductor chip, wherein the substrate has conductive leads thereon, the leads being electrically connected to terminals on a first end and bonded to respective chip contacts on a second end. Typically, the spacer layer is comprised of a compliant or elastomeric material. A protective layer is attached on a bottom surface of the sheet-like substrate so as to cover the terminals on the substrate and to seal any apertures in the substrate. After the attachment of the protective layer, a flowable, curable encapsulant material is deposited around at least a portion of a periphery of the semiconductor chip so as to encapsulate the leads. The protective layer prevents the encapsulant from flowing through any substrate apertures. The encapsulant material is then cured or at least semi-cured to allow for handling or further processing.

Typically, the protective layer and/or the substrate is attached to a flat frame so as to hold the chip bearing area of the substrate taut and/or level during the encapsulation step. Preferably, the encapsulation method is performed on a plurality of chips which are sharing a common frame. After encapsulating and curing, the chip packages may be separated or singulated ("diced") from the frame a predetermined distance from the periphery of the chip. The dicing step may be performed so that the package is no larger than the contact bearing surface of the chip or may be performed so that deposited and cured encapsulant bumpers are provided around the periphery of the singulated chip. In the latter case, the substrate terminals may not only lie beneath the periphery of the chip, but also in an area beyond the periphery of the chip such that these "outside terminals" are supported by the encapsulant bumpers. A membrane, heat sink, protective ring, etc. may further be attached to the exposed surfaces of the chip and bumpers to aid in the package's structural integrity.

In a further variation, the spacer layer may be comprised of a plurality of spacer pads, typically comprised of a compliant material. Thus the depositing step in such an embodiment further includes the step of injecting the encapsulant between the compliant pads.

In a still further package variant, the chip assembly may be placed terminals first into a mold prior to the encapsulation step. Raised terminals are used to space the substrate a certain distance away from the bottom of the mold. However, the mold protects at least a portion of the raised terminals. The encapsulant is then deposited and cured resulting in a package that has a substrate imbedded within the cured encapsulant, with only the raised terminals protruding beyond the bottom surface of the cured encapsulant.

The foregoing and other objects and advantages of the present invention will be better understood from the following Detailed Description of a Preferred Embodiment, taken together with the attached FIG.

DETAILED DESCRIPTION OF A PREFERRED EMBODIMENT

Figure 1:
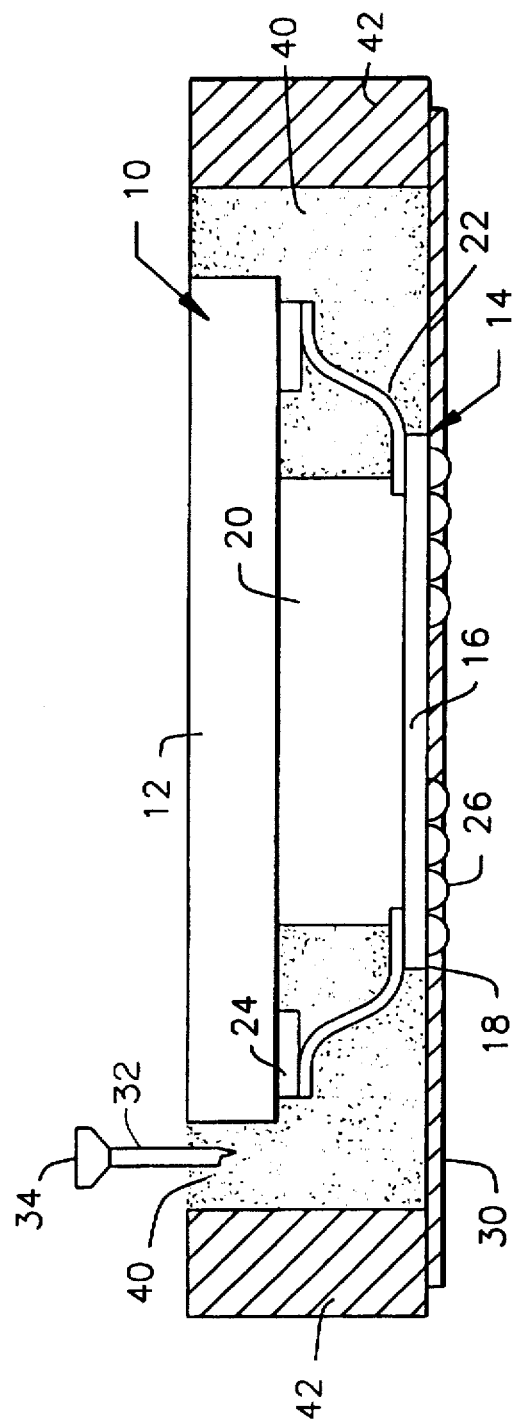
FIG. 1 is a side cross-sectional view, illustrating a semiconductor chip package assembly being encapsulated in an inverted position within a frame, according to the present invention.

Referring to FIG. 1, a semiconductor chip package assembly, generally designated as 10, includes a semiconductor chip 12 and a chip carrier 14. The chip carrier 14 is made up of a dielectric layer 16 (which may be flexible or rigid and is preferably made from a thin sheet of material such as polyimide) and a spacer layer 20 (typically compliant or elastomeric, referred to herein as a "compliant layer") disposed between the dielectric layer 16 and the semiconductor chip 12. The semiconductor chip 12 and the chip carrier 14 are electrically connected through a plurality of leads 22 which are connected to the chip 12 through chip contacts 24. The leads 22 are further electrically connected to terminals 26 on the top surface 18 of the chip carrier 14. The terminals 26 connect the semiconductor chip assembly 10 to a printed wiring board ("PWB") or other substrate (not shown), thus the terminals 26 should remain uncontaminated throughout testing and final assembly so as to ensure a good electrical connection with the PWB.

FIG. 1 further shows the semiconductor chip package assembly 10 positioned within a ring, frame or panel 42 (generically referred to herein as a "frame"). Typically, frame 42 is comprised of a substantially planar sheet of material having an aperture within which the semiconductor chip package assembly 10 is placed such that there is a gap between each edge of the chip assembly and each respective side wall of the frame 42, as shown.

Figure 2:
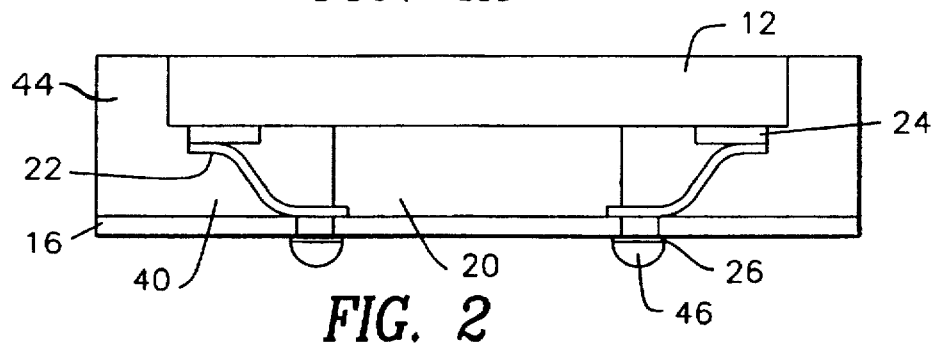
FIG. 2 is a side cross-sectional view of a singulated device having bumpers around the periphery of the chip package assembly, according to the present invention.

A solder mask or coverlay 30 (referred to generically herein as "coverlay") is attached to the frame 42, and stretched taut across the aperture in the frame 42 to better ensure the dimensional stability of the substrate. The coverlay 30 is further attached to top surface 18 of the dielectric layer 16 so that it holds the chip assembly 10 in position within the frame 42. The coverlay 30 is preferably made of a photo-sensitive dielectric polymer material such as Dupont Pryralux PC 1025. The coverlay 30 is further typically adhesively attached to both the frame 42 and the dielectric layer 16, such as by using a vacuum lamination technique well known to those skilled in the art, so that the terminals 26 are protected from the encapsulant material 40 which is subsequently deposited, as described below. This can be accomplished by vacuum laminating the coverlay 30 over the terminals 26 or by providing apertures in the coverlay 30 which are aligned with the terminals 26 so that the terminals may be disposed therein (as shown in FIG. 1). Preferably, the terminals 26 are not rounded bumps (as shown) but are substantially flat pads on the surface of the dielectric layer 16, and may just be an extension and broadening out of leads 22. In such a flat terminal embodiment (such as shown in FIGS. 2 and 4), a photosensitive coverlay 30 may be adhered to the top surface 18 of the dielectric layer 16 so that the portions of the coverlay 30 overlying the terminals may be removed using photolithographic techniques at a later time. The coverlay 30 may be attached to the frame 42 prior to attachment of the dielectric layer 16 of the chip assembly 10 or the chip assembly 10 may be attached to the coverlay 30 layer prior to the attachment of the coverlay layer 30 to the frame 42.

Once the semiconductor chip assembly 10 has been positioned and attached to the coverlay and ring, encapsulation material 40 is introduced into the open area between the frame 42 and the periphery of the semiconductor chip assembly 10. The encapsulation material 40 is comprised of a curable liquid which will allow the leads 22 to "flex" after the encapsulant 40 has been cured in response to thermal cycling forces during operation of the finished package. In the preferred embodiment, the encapsulant is comprised of an electronic grade silicone-based or epoxy-based resin; although, other materials may be used. The curing mechanism of the encapsulation material 40 will depend on the particular encapsulant material used so that the encapsulant can be cured or partially cured. Typical curing mechanisms are radiant energy, thermal energy, moisture or ultraviolet light.

The introduction of encapsulant 40 may take place by using a needle-like dispenser 32 connected to an encapsulant source 34 (such as a CAM/ALOT programmable dispensing machine manufactured by Camelot Systems, Inc. in Haverhill, Mass.); although, this step could also be accomplished using other processes. Typically, the dispenser 32 is moved around the periphery of the chip 12 until the desired level of encapsulant 40 has been substantially uniformily dispensed therearound; although, the dispensing operation need not be exact because the terminals 26 are protected from contamination by the coverlay 30 (covering the chip carrier 14) and the frame 42 (bounding the encapsulant 40 on the sides). In the embodiment shown in FIG. 1, the encapsulant is dispensed such that the level of the encapsulant 40 is just below the plane of the back surface of the chip 12. If the frame 42 is not removed from the finished package, dispensing the encapsulant 40 to the level of the back surface of the chip 12 and then curing the encapsulant allows the finished package to have more structural integrity.

The semiconductor chip package assembly and frame/ encapsulant surrounding structure may then be attached to a PWB using a suitable conductive bonding material, such as eutectic solder. Alternately, a dicing means (such as a dicing saw, water jet, ultrasonic knife, rotary razor, laser, etc.) may be employed to separate the encapsulated chip assembly structure from the frame 42 so that the resultant chip package is no wider or only slightly wider than the periphery of the chip 12 itself. This allows for the option of having a protective "bumper" 44 of cured encapsulant material around the periphery of the semiconductor chip assembly as shown in FIG. 2. In such an embodiment, the dielectric layer 16 is juxtaposed with the contact bearing surface of the chip 12, as before; however, the dielectric layer 16 in the diced package embodiment shown FIG. 2 is larger than the contact bearing surface of the chip 12 such that it extends beyond the perimeter of the chip 12. The encapsulant 40 correspondingly extends beyond the chip perimeter to form a bumper 44 of encapsulant material. The bumper 44 further protects the edges of the chip and the metallurgy of the joint between the leads 22 and the contacts 24. The bumper also provides added durability to the package by protecting the sides of the chip 12.

Most preferably, the encapsulant 40 is deposited such that it does not flow onto the back surface (non-contact bearing surface) of the chip 12. This allows the back surface of the chip to subsequently be connected to a heat sink or thermal spreader without an insulative material impeding the dissipation of heat from the chip 12 during thermal cycling. In some embodiments, the back surface of the chip 12 may be protected with a removable membrane, film or other layer to substantially reduce or eliminate the possibility of such contamination, as described in more detail in the embodiments discussed below.

Figure 3B:
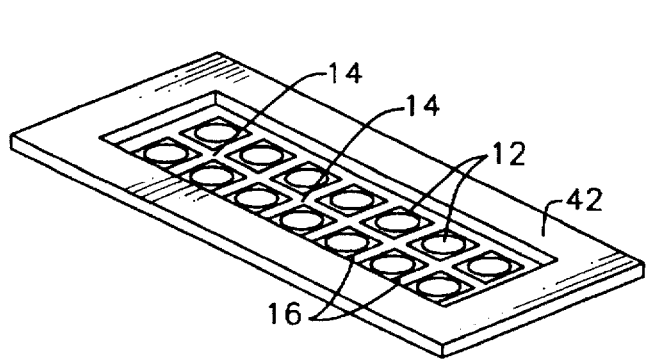
FIGS. 3A and 3B show various views of the encapsulation technique shown in FIG. 1 used with a plurality of devices on a common frame, according to the present invention.
Figure 3A:
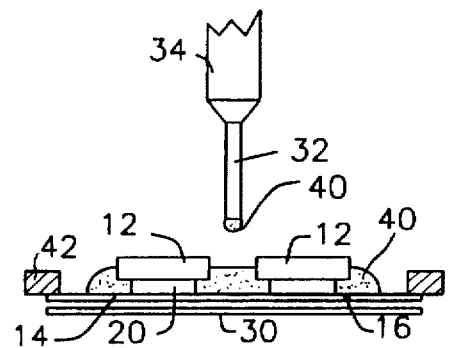

In an alternate embodiment shown in FIGS. 3A and 3B, the encapsulant can be dispensed so that it just covers the cavity between the leads 22, the compliant layer 20 and the dielectric layer 16 such that the cured encapsulant either is deposited to approximately the level of the contact bearing surface of the chip 12 or just protrudes slightly from the cavity between the chip 12 and the coverlay 30. In such an embodiment, the encapsulated chip assembly is typically diced so that the finished package is no larger than the periphery of the chip 12 itself, as shown in FIG. 4A and 4B.

The embodiment shown in FIGS. 3A and 3B show that the encapsulation of the semiconductor chip assemblies 10 can be performed on a plurality of package assemblies 10 simultaneously, i.e. where the aperture in the frame 42 is large enough to accept many semiconductor chip assemblies 10 on the same coverlay 30. In this embodiment, it is preferable to have each chip 12 connected to the same chip carrier 14/coverlay 30 combination, as shown in FIG. 3A. Added manufacturing efficiency can be reached by encapsulating a plurality of such packages within the same frame by dispensing encapsulant in a first direction between and along the adjacent packages from one side of the frame 42 to the next before having to dispense in an orthogonal direction between and along such packages. The encapsulated chip assemblies may then be cut away or "diced" into individual chip packages or into interconnected multi-chip packages. The encapsulation of many chips 12 simultaneously is preferred to facilitate the mass production of finished packages. As described above, the encapsulant 40 is deposited from the chip side of the coverlay 30 and the coverlay ensures that the encapsulant 40 is bounded when it is deposited in liquid form such that it does not escape through possible bonding apertures 50 (FIG. 4B) and contaminate the terminals 26 and thus impede any subsequent electrical connection of the terminals to bond pads on a PWB. The frame 42 also acts as a barrier to provide a side boundary for the deposited encapsulant 40 should the need arise.

After the encapsulant has been deposited, the frame 42 can be placed within a temperature/pressure chamber so as to remove any possible voids or gas bubbles in the encapsulant and to cure the encapsulant 40, as described in U.S. patent application Ser. No. 610,610.

Figure 4A:
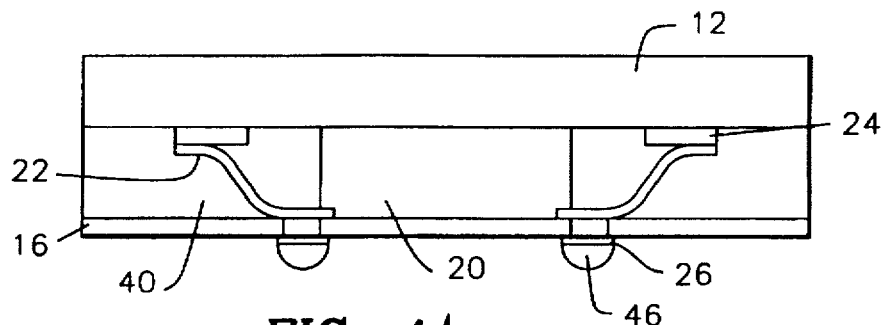
FIG. 4A is a side cross-sectional view of a singulated chip package assembly, according to the present invention.
Figure 4B:
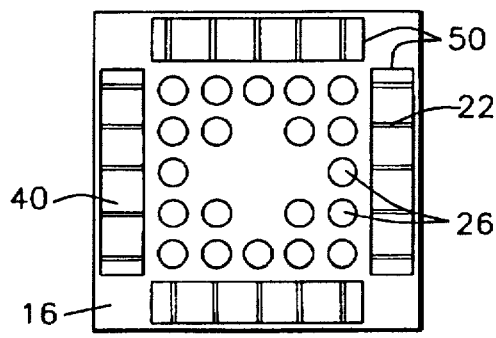
FIG. 4B is a face view of the chip package assembly shown in FIG. 4A, according to the present invention.

As described above, after the encapsulant 40 has been cured, the semiconductor chip packages within the frame 42 are next separated (or "diced") from the chip carrier 14 into single packaged chips, such as that shown in FIGS. 2 and 4A, or the packaged chip may be diced into multi-chip modules.

The finished package shown in FIG. 2 has some benefits compared with the package shown in FIG. 4A. First, in FIG. 2, the dielectric layer 16 is extended to be the same size as the contact bearing surface of the chip 12. This allows the cured encapsulant layer 40 to have a substantially uniform thickness at every point between the chip 12 and the dielectric layer 16, even at the periphery of the package. This provides added support for the leads 260 during thermal cycling of the component as well as physical and environmental protection for the metallurgy of the connection between the leads 260 and the contacts 270. Further, as described above, the embodiment shown in FIG. 2 has a bumper 44 of encapsulant 40 for added physical and environmental protection.

Figure 5:
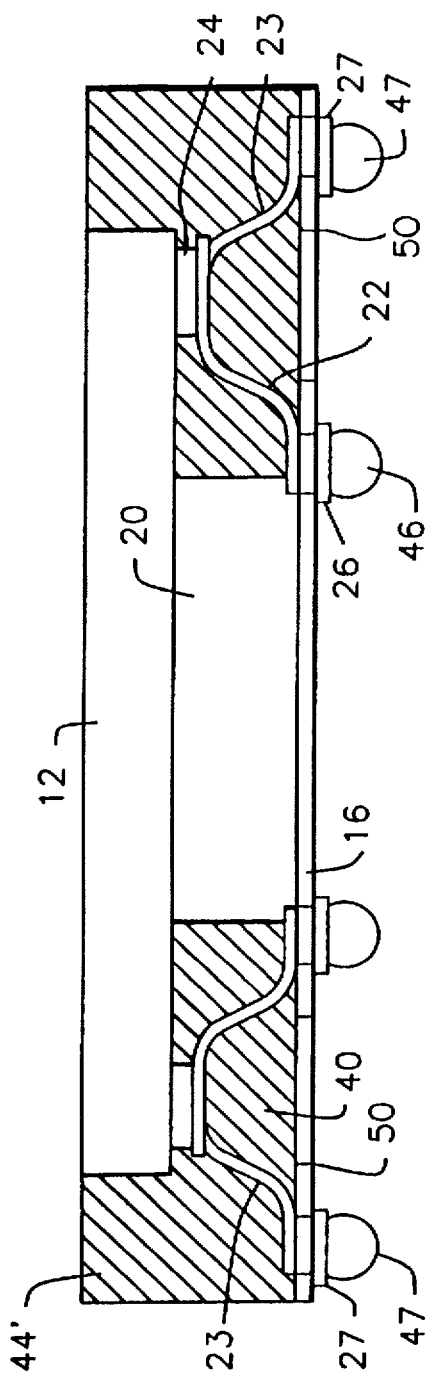
FIG. 5 is a side cross-sectional view of a singulated device having bumpers around the periphery of the chip package assembly and further having terminals beyond the periphery of the periphery of the chip, according to the present invention.

FIG. 5 shows a still further package embodiment which is diced such that it has extended bumpers 44' which support at least one outer row of terminals 27 which lie outside the periphery of the contact-bearing surface of the chip 12. The terminals 27 are electrically connected through leads 23 which are bonded down through the bonding apertures 50. A rigid back plate, typically made of a thermally conductive material, may be attached to the back surface of the chip and bumpers to add support to the outer row of terminals. Alternately, a rigid ring may be attached solely to the back surface and/or side surfaces of the bumpers thereby providing support to the outer row of terminals and further providing a direct thermal path to the back of the chip.

Figure 6A:
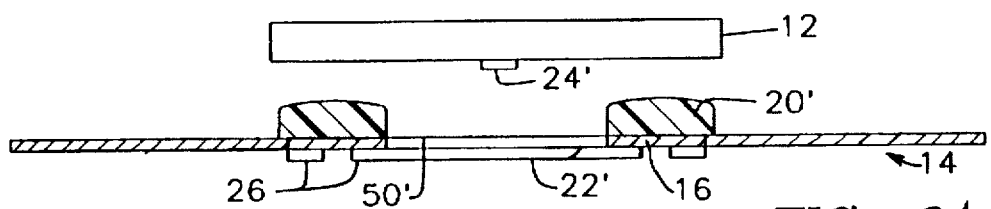
FIGS. 6A–6G show the process steps for encapsulating a center bonded semiconductor chip package assembly, according to the present invention.
Figure 6B:
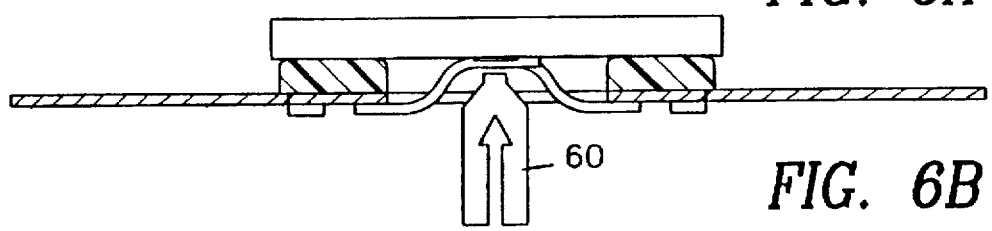
Figure 6C:
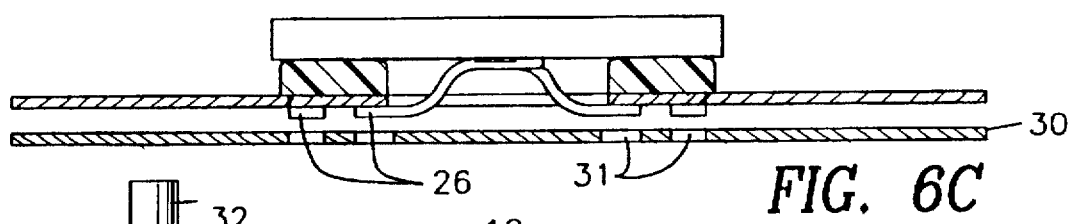
Figure 6D:
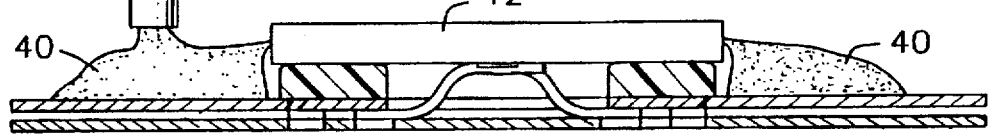
Figure 6E:
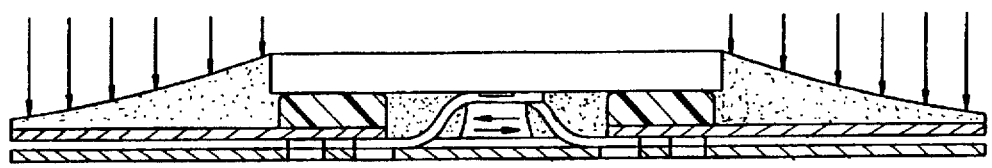
Figure 6F:
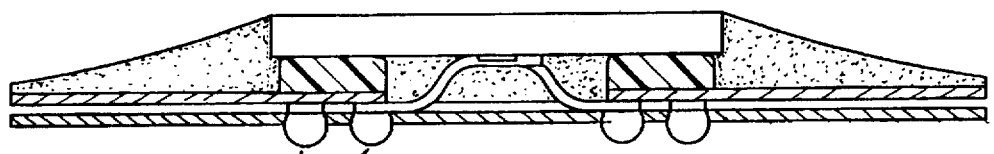
Figure 6G:
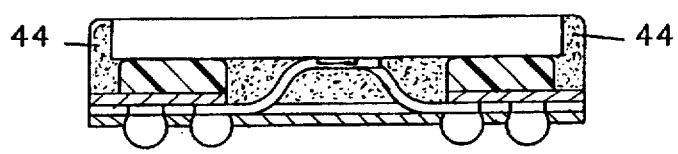

FIGS. 6A–G show the process steps for encapsulating a semiconductor chip package, such as is described above, for a chip package embodiment which has chip contacts 24' that are located in the center of the face surface of the chip 12. In this embodiment, the compliant layer consists of two separate compliant pads 20' attached to the dielectric layer 16 and positioned on either side of the row of chip contacts 24'. Likewise, the leads 22' extend into the centrally located bonding aperture 50' and are aligned such that they may be bonded to respective chip contacts 24' using a bonding tool 60 and an appropriate energy source (such as ultrasonic, thermocompression or thermosonic energy), as shown in FIG. 6B. The leads 22' are bonded to the contacts 24' in somewhat of an interleaving pattern. As shown in FIG. 6C and described in more detail above. The coverlay 30 attached to the chip carrier 14 typically using a vacuum lamination technique. Apertures 31 in the coverlay 30 allow electrical connection with the terminals 26. In FIG. 6D, the dispenser 32 deposits a liquid encapsulant 40 around the periphery of the chip 12. The amount or volume of the deposited encapsulant need not be tightly regulated; however preferably, the encapsulant 40 does not get on to the exposed back surface of the chip 12, so that the chip 12 may dissipate heat more easily when the packaged semiconductor chip is in operation, as described above. In FIGS. 6E–6F, uniform pressure is applied to the outside of the assembly to create a uniform, substantially void/bubble free encapsulant layer by collapsing the voids/bubbles therein, as described in more detail in U.S. patent application Ser. No. 610,610 filed Mar. 7, 1996. FIG. 6G shows the packaged chip after it has been diced away from the rest of the encapsulant 40/coverlay 14. This package has been diced to create the protective bumpers 44, shown in FIG. 2; however, it could be diced such that no bumper 44 exists.

Figure 7A:
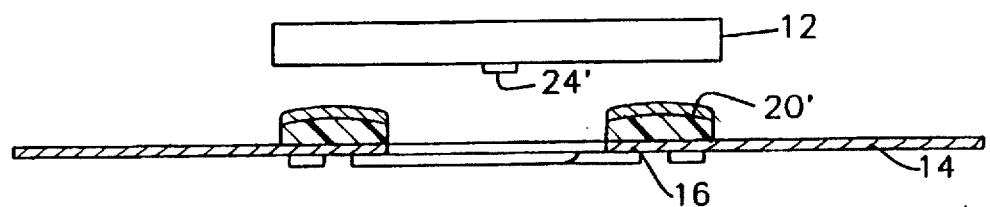
FIGS. 7A–7G show the process steps for encapsulating a center bonded semiconductor chip package assembly as shown in FIGS. 6A–6G with a flexible membrane attached thereto, according to the present invention.
Figure 7B:
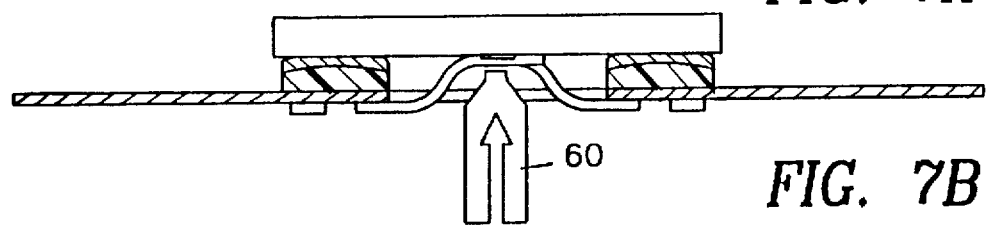
Figure 7C:
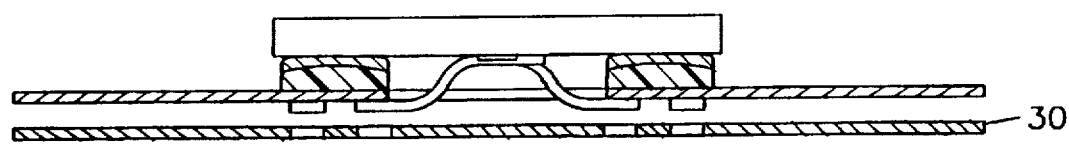
Figure 7D:
Figure 7E:
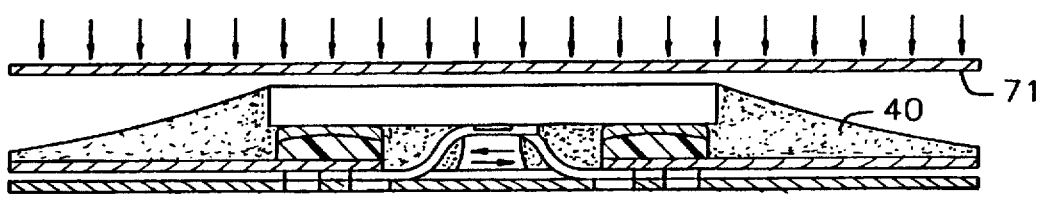
Figure 7F:
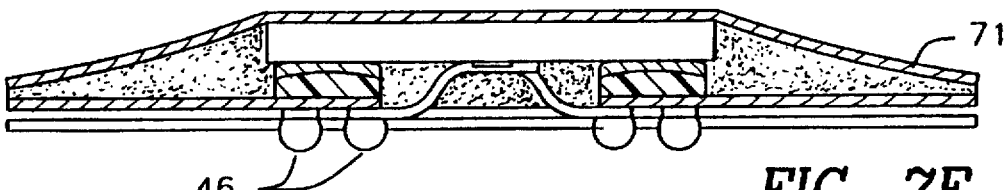
Figure 7G:
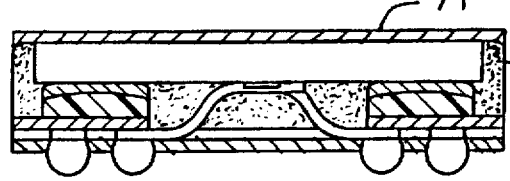
Figure 9A:
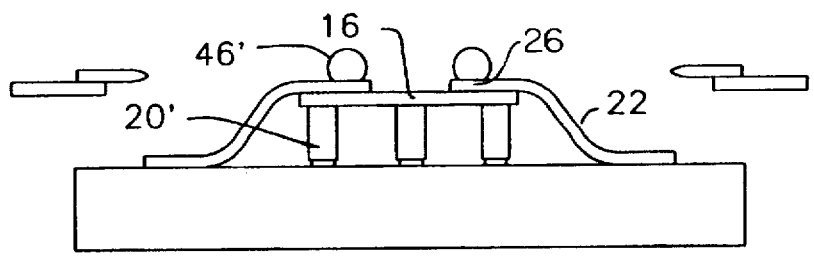
FIGS. 9A–9D show the process steps for encapsulating a semiconductor chip package assembly in which the chip carrier is encapsulated leaving only the raised terminals to protrude from the face surface of the chip package, according to the present invention.
Figure 9B:
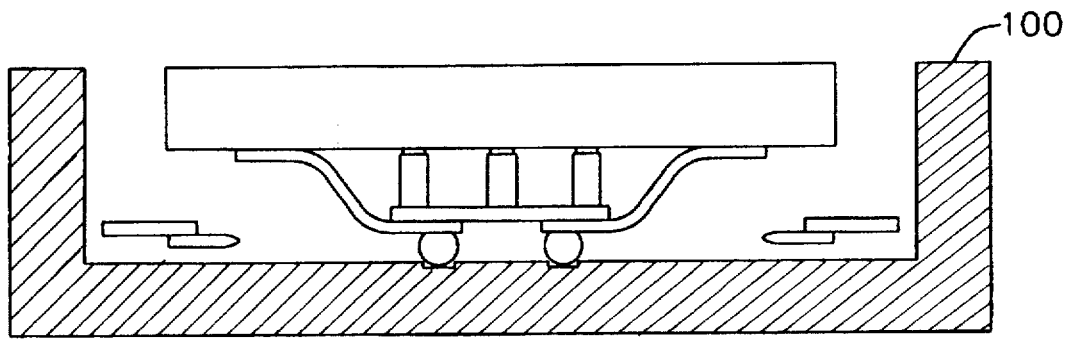
Figure 9C:
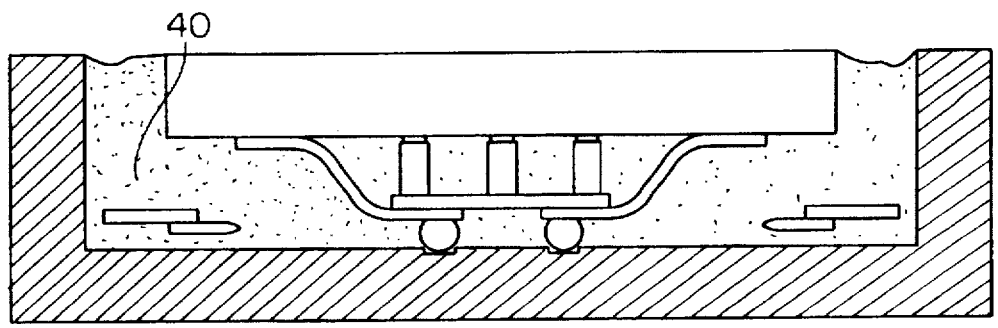
Figure 9D:
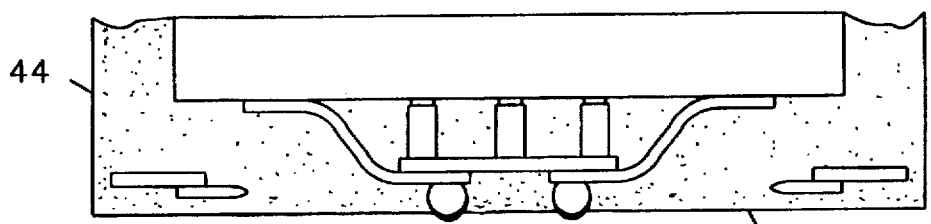
Figure 10A:
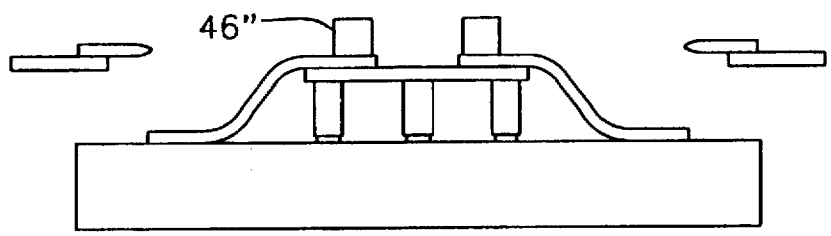
FIGS. 10A–10D show a process similar to that shown in FIGS. 9A–9D except that the raised terminals are removed after the encapsulation/cure steps, according to the present invention.
Figure 10B:
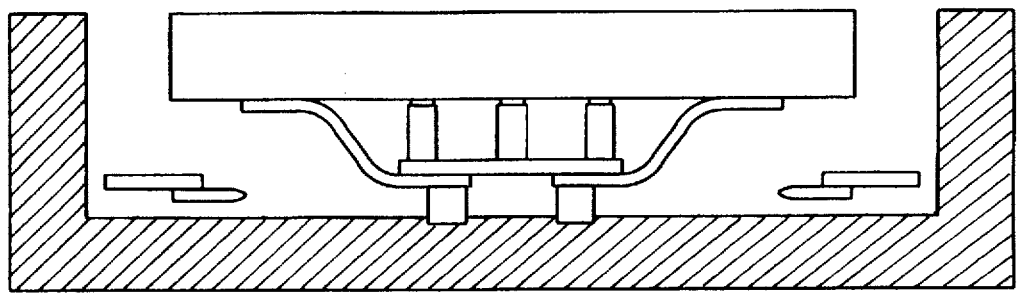
Figure 10C:
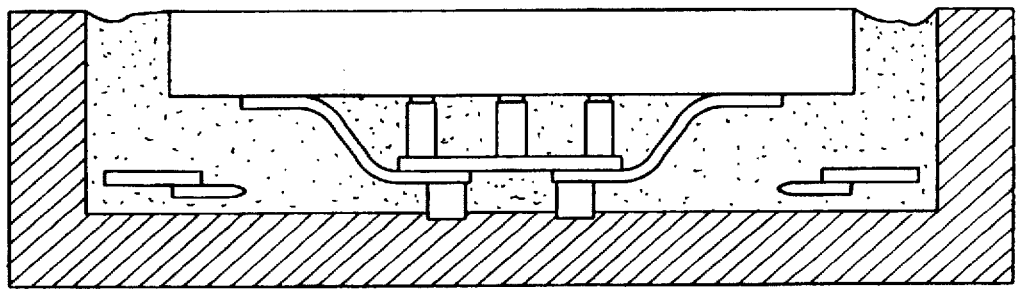
Figure 10D:
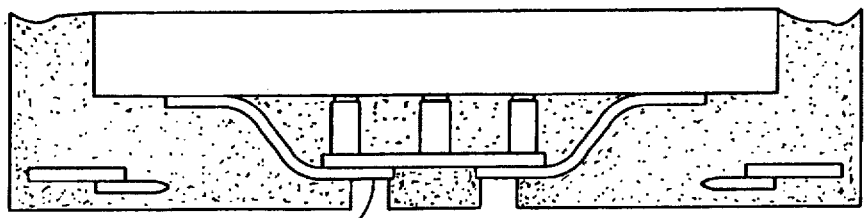

FIGS. 7A–7G show a variation in the process shown in FIGS. 6A–6G where a membrane 71 may be applied or deposited in a sheet form atop the assembly, as shown in FIGS. 7F and 7G. The membrane is flexible and is biased such that it comes into intimate contact with the back surface of the chip 12, and preferably is laminated or otherwise attached thereto. The portions of the membrane 71 beyond the periphery of the chip 12 may be used to mechanically force the encapsulant around the leads 22' and beneath the chip 12 (if required). The membrane 71 also helps to ensure that encapsulant 40 does not get onto the back surface of the chip 12, as described above. After the encapsulant is cured, the membrane 71 is typically sealed to the back of the chip 12 and cured encapsulant. After the assembly has been diced, the membrane protects the back surface of the chip 12 and further binds the bumper portions 44 so that they do not de-laminate from the side edges of the chip 12, as shown in FIG. 7G. The membrane 71 may be comprised of thermally conductive material (such as a heat bondable thermal conductor) such that a cooling surface or heat sink may be attached thereto. Alternately, the membrane 71 may be removed from the back of the die leaving the back surface of the chip 12 bare to be subsequently attached to a cooling surface or heat sink.

Figure 8:
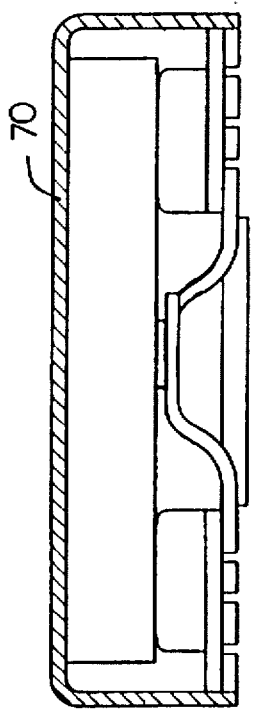
FIG. 8 is a side cross-sectional view of a singulated device having bumpers around the periphery of the chip package assembly and further having a protective membrane attached to the exposed surfaces of the chip and bumpers, according to the present invention.

In a variation such as is shown in FIG. 8, a membrane 70 is applied in a sheet form around the exposed surfaces of the chip 12 and bumpers 44 after the dicing step typically using a vacuum lamination technique, in effect, laminating the membrane 70 to the back surface of the chip and exposed surface of the bumpers 44. Such a membrane 70 may be permanently sealed to the back of the chip protecting the chip and further binding the bumper portions so that they do not de-laminate from the side edges of the chip. This may be used in conjunction with other package variations, such as shown in FIG. 5. Alternately, the membrane 70 could just be attached to the exposed back of the chip and the tops of the bumper portions without wrapping around the exposed sides of the bumpers.

FIGS. 9A–9D show an overmolded encapsulation technique similar to that described above except that the encapsulant 40' completely encompasses the dielectric layer 16' thereby allowing only the raised terminals 46' to be exposed. Using this technique, the chip 12 is assembled to the chip carrier 14, as described above. In these figures, the compliant layer has been replaced by a plurality of compliant pads 20' which provide a stand off or gap between the substrate 16, and the contact bearing face surface of the a semiconductor chip 12, further described in U.S. patent application Ser. Nos. 365,699 and 610,610 both commonly assigned and hereby incorporated by reference. Raised terminals 46' lie above the terminal pads 26'. This assembly is then placed terminals first into a mold. The raised terminals provide a stand-off between the substrate and the mold 100. Encapsulant 40 is then introduced into the mold such that at least a portion of the raised terminals 46' are protected from the encapsulant 40. This can be accomplished any number of ways, such as providing recessed areas in the mold for receiving the raised terminals. The construction of the mold 100 is not critical so long as it does not impede the flow of the encapsulant 40. After the encapsulant has been deposited such that it encapsulates the entire package (or packages if a plurality of packages are being simultaneously encapsulated) including the front surface of the dielectric layer 16, the encapsulant is cured and the mold 100 is removed. The removal of the mold can be accomplished by dissolving the mold or making the mold such that the encapsulant 40 does not wet to its surface. This produces a package which has a front face 110 completely comprised of the cured encapsulant material except for the raised terminals. The packages are then separated or diced from the frame 42 or each other as needed.

FIGS. 10A–10D show a process for encapsulating which is substantially similar to that shown in FIGS. 9A–9D except that sacrificial raised terminals 46" are used. After the package has been encapsulated in the mold, the mold 100 is removed. The sacrificial terminals are then also removed, typically by a dissolving or etching process. Solderballs or other connection means can then be directly attached to the terminals 26. The parts are then separated from the frame 42 as needed.

Figure 11:
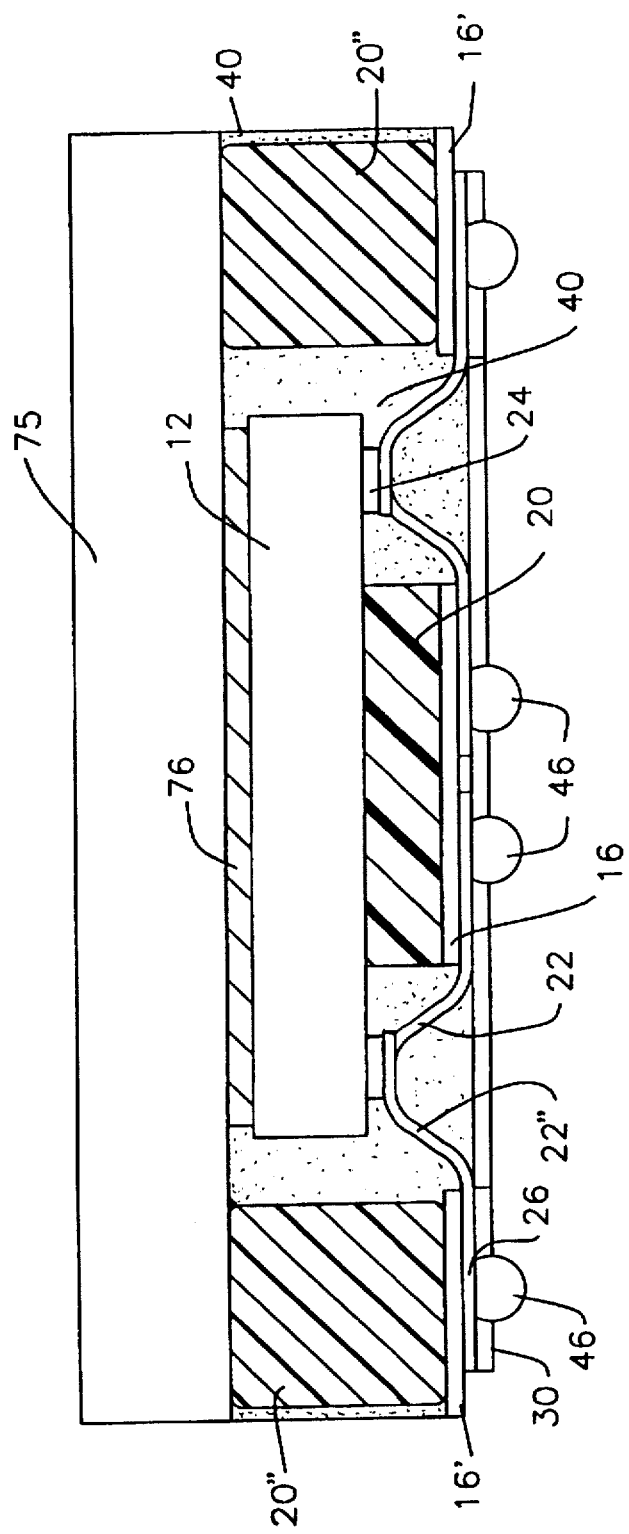
FIG. 11 shows a cross-sectional side view of a so called fan-in/fan-out embodiment of the present invention.

FIG. 11 shows a cross-sectional side view of a so called fan-in/fan-out embodiment of the present invention. As shown, a fan-in/fan out package has terminals 26 which both overly the chip surface and are also positioned beyond the periphery of the chip 12 on the dielectric substrate layer 16/16'. Here, the chip 12 is attached to a rigid, thermally conductive plate 75, typically using conventional thermally conductive die attach adhesive 76, such as a silver filled epoxy or the like. The dielectric layer 16 overlies both the face surface of the chip 12 and a surface of the rigid plate 75 and is adhered to each such surface with a compliant layer 20/20". As described above, compliant layer 20 may be comprised of a single layer/pad or a plurality of pads/posts and compliantly supports the dielectric layer 16. Compliant layer 20" also compliantly supports the outer dielectric layer 16' and is preferably comprised of a plurality of pads/posts 20" which are positioned around the outer periphery of the chip 12 such that the outer dielectric layer 16' is somewhat uniformity supported. The conductive leads 22/22" are then bonded through the bonding apertures 50 to respective chip contacts 24 typically using an interstitial lead design, where adjacent leads are connected to opposite dielectric layers 16/16'. The leads interconnect respective terminals 26 and chip contacts 24. After the leads are bonded, the coverlay 30 is placed over the exposed surface of the dielectric layers 16/16' such that the bonding apertures 50 are sealed. Encapsulant 40 is then deposited around at least a portion of the periphery of the assembly. The encapsulant flows into and between the pads 20" so as to create a substantially void/bubble free encapsulant layer between and around the other package elements. The encapsulant is then cured and the package is diced. The embodiment shown in FIG. 11 can be produced one at a time. Preferably, however, it is produced using a panel process, as described above, such that many chips 12 can be packaged simultaneously. In such a plural embodiment, the bumpers 44, described above, could also be disposed around the outside periphery of the package such that the peripheral edges of the rigid plate 76 in the resulting package are covered by cured encapsulant. Obviously, the embodiment shown in FIG. 11 could also be used to produce a fan-out only (no terminals overlying the chip) chip package.

Having fully described several embodiments of the present invention, it will be apparent to those of ordinary skill in the art that numerous alternatives and equivalents exist which do not depart from the invention set forth above. It is therefore to be understood that the present invention is not to be limited by the foregoing description, but only by the appended claims.

What is claimed is:

1. A method of encapsulating a semiconductor device, comprising the steps of:

disposing a spacer layer between a top surface of a sheet-like substrate and a contact bearing surface of a semiconductor chip, wherein the substrate has terminals thereon and bonding windows such that conductive leads electrically connected to the terminals extend at least partially thereacross and are juxtaposed with respective chip contacts;

bonding the leads to respective chip contacts;

attaching a protective layer on a bottom surface of the substrate so as to cover the bonding windows;

depositing flowable encapsulation material around at least a portion of the periphery of the chip after attaching the protective layer so as to encapsulate the bonded leads; and at least partially curing the encapsulation material.

2. The method as claimed in claim 1, wherein the spacer layer is comprised of a compliant material.

3. The method as claimed in claim 1, further including the step of dicing the encapsulated chip from the substrate.

4. The method as claimed in claim 3, wherein the dicing step further includes the step of creating cured encapsulant bumpers around the periphery of the chip.

5. The method as claimed in claim 3, wherein a plurality of semiconductor devices are simultaneously encapsulated.

6. The method as claimed in claim 5, wherein the dicing step singulates each semiconductor device.

7. The method as claimed in claim 6, further comprising the step of attaching the substrate to a frame prior to the depositing step so as to hold the substrate substantially taut in an area bearing the semiconductor devices thereby defining a multi-device frame assembly.

8. The method as claimed in claim 6, further comprising the step of attaching the protective layer to a frame prior to the depositing step so as to hold the substrate substantially taut in an area bearing the semiconductor devices thereby defining a multi-device frame assembly.

9. The method as claimed in claim 3, further comprising the step of removing portions of the protective layer to expose the substrate terminals wherein the terminals lie beneath the periphery of the chip.

10. The method as claimed in claim 4, further comprising the step of removing portions of the protective layer to expose the substrate terminals wherein at least some of the terminals lie outside of the periphery of the chip and are supported by the bumpers.

11. The method as claimed in claim 4, further comprising the step of attaching a membrane to the exposed surfaces of the chip and the bumpers.

12. The method as claimed in claim 2, wherein the compliant layer is comprised of a plurality of compliant pads.

13. The method as claimed in claim 12, wherein the depositing step is performed so that the encapsulant flows between the compliant pads.

14. A method of encapsulating a semiconductor device, comprising the steps of:

disposing a spacer layer between a top surface of a sheet-like substrate and a contact bearing surface of a semiconductor chip, wherein the substrate has conductive leads thereon, the leads being electrically connected to terminals on the substrate on a first end and bonded to respective chip contacts on a second end;

attaching a protective layer on a bottom surface of the substrate so as to cover the terminals;

depositing flowable encapsulation material around at least a portion of the periphery of the chip after attaching the protective layer so as to encapsulate the bonded leads; and curing the encapsulation material.

15. The method as claimed in claim 14, wherein the spacer layer is comprised of a compliant material.

16. The method as claimed in claim 14, further including the step of dicing the encapsulated chip from the substrate.

17. The method as claimed in claim 16, wherein the dicing step further includes the step of creating cured encapsulant bumpers around the periphery of the chip.

18. The method as claimed in claim 16, wherein a plurality of semiconductor devices are simultaneously encapsulated and wherein the dicing step singulates each semiconductor device.

19. The method as claimed in claim 18, further comprising the step of attaching the substrate to a frame prior to the depositing step to hold the substrate substantially taut in an area bearing the semiconductor devices thereby defining a multi-device frame assembly.

20. The method as claimed in claim 18, further comprising the step of attaching the protective layer to a frame prior to the depositing step so as to hold the substrate substantially taut in an area bearing the semiconductor devices thereby defining a multi-device frame assembly.

21. The method as claimed in claim 16, further comprising the step of removing portions of the protective layer to expose the substrate terminals wherein the terminals lie beneath the periphery of the chip.

22. The method as claimed in claim 17, further comprising the step of removing portions of the protective layer to expose the substrate terminals wherein at least some of the terminals lie outside of the periphery of the chip and are supported by the bumpers.

23. The method as claimed in claim 17, further comprising the step of attaching a membrane to the exposed surfaces of the chip and the bumpers.

24. The method as claimed in claim 14, wherein the compliant layer is comprised of a plurality of compliant pads.

25. The method as claimed in claim 24, wherein the depositing step is performed so that the encapsulant flows between the compliant pads.

26. A method of encapsulating a semiconductor device, comprising the steps of:

disposing a spacer layer between a top surface of a sheet-like substrate and a contact bearing surface of a semiconductor chip, wherein the substrate has conductive leads which are electrically connected to terminals on the substrate on a first end and bonded to respective chip contacts on a second end;

placing raised terminals atop the terminal regions;

placing the semiconductor device into a mold prior to the encapsulation step wherein the raised terminals provide a stand-off between substrate and the mold;

depositing flowable encapsulation material into the mold around a at least a portion of the periphery of the chip so as to encapsulate the leads and substrate while leaving at least a portion of the raised terminals exposed; and removing the mold after at least a portion of the encapsulation material has been cured.

27. The method as claimed in claim 26, wherein the spacer layer is comprised of a compliant material.

28. The method as claimed in claim 26, further comprising the step of removing the raised terminals after the removal of the mold.

29. The method as claimed in claim 26, wherein a plurality of semiconductor devices are simultaneously encapsulated within the same mold.

30. The method as claimed in claim 29, further including the step of dicing the encapsulated packages after removing the mold.

31. The method as claimed in claim 29, wherein the dicing step further includes the step of creating cured encapsulant bumpers around the periphery of the chip.

32. The method as claimed in claim 31, wherein at least some of the terminals lie outside of the periphery of the chip and are supported by the bumpers.

33. The method as claimed in claim 26, wherein the compliant layer is comprised of a plurality of compliant pads.

34. The method as claimed in claim 33, wherein the depositing step is performed so that the encapsulant flows between the compliant pads.

35. A method of encapsulating a semiconductor device assembly, comprising the steps of:

providing a sheet-like, dielectric substrate having a first and second surface and an inner portion and an outer portion, the inner and outer portions being separated by at least one bonding window extending through the substrate, the substrate further having conductive terminals on at least the outer portion on the second surface of the substrate;

providing a rigid element having first and second opposite surfaces;

attaching a back surface of a semiconductor chip to the first surface of the rigid element;

disposing a first spacer layer between the first surface of the inner portion of the substrate and a contact-bearing face surface of the chip so that both the substrate and the chip are adhered thereto;

disposing a second spacer layer between the first surface of the outer portion of the substrate and the first surface of the rigid element and a contact-bearing face surface of the chip so that both the substrate and the rigid element are adhered thereto;

electrically connecting the terminals to respective chip contacts through the at least one bonding window in the substrate;

attaching a protective layer on a bottom surface of the substrate so as to cover the bonding windows;

depositing flowable encapsulation material around at least a portion of the periphery of the chip after attaching the protective layer so as to encapsulate the bonded leads; and at least partially curing the encapsulation material.

36. The method as claimed in claim 35, wherein the first and second spacer layers are comprised of a compliant material.

37. The method as claimed in claim 36, wherein the substrate further having conductive terminals on both the inner and outer portions on the second surface of the substrate.

38. The method as claimed in claim 35, wherein the bonding window completely separates the inner and outer portions of the substrate from each other.

39. The method as claimed in claim 36, further including the step of dicing the encapsulated chip assembly from the substrate.

40. The method as claimed in claim 39, wherein the dicing step further includes the step of creating cured encapsulant bumpers around the periphery of the chip assembly.

41. The method as claimed in claim 39, wherein a plurality of semiconductor chip assemblies are simultaneously encapsulated.

42. The method as claimed in claim 41, further comprising the step of attaching the substrate to a frame prior to the depositing step so as to hold the substrate substantially taut in an area bearing the semiconductor devices thereby defining a multi-device frame assembly.

43. The method as claimed in claim 41, further comprising the step of attaching the protective layer to a frame prior to the depositing step so as to hold the substrate substantially taut in an area bearing the semiconductor devices thereby defining a multi-device frame assembly.

44. The method as claimed in claim 39, further comprising the step of removing portions of the protective layer to expose the substrate terminals.

45. The method as claimed in claim 35, wherein the first spacer layer is comprised of a plurality of compliant pads.

46. The method as claimed in claim 35, wherein the second spacer layer is comprised of a plurality of compliant pads.

47. The method as claimed in claim 45 or 46, wherein the depositing step is performed so that the encapsulant flows between the compliant pads.

* * * * *